US006073333A

United States Patent [19]

Orr

[11] Patent Number: 6,073,333

[45] Date of Patent: Jun. 13, 2000

[54] METHOD FOR MANUFACTURE AND ASSEMBLY OF COMPUTERS

[76] Inventor: Tom Orr, 1300 Gulfview Woods La., Tarpon Springs, Fla. 34689

[21] Appl. No.: 09/263,640

[22] Filed: Mar. 5, 1999

Related U.S. Application Data

[63] Continuation-in-part of application No. 08/840,028, Apr. 24, 1997, Pat. No. 5,909,357.

[51] Int. Cl.[7] .................... B23P 21/00

[52] U.S. Cl. .................... 29/469; 29/407.01; 361/687; 361/690

[58] Field of Search .................... 29/407.01, 464, 29/469; 361/683, 685, 724–727, 687–690, 692

[56] References Cited

U.S. PATENT DOCUMENTS

| | | | |
|---|---|---|---|
| 4,501,460 | 2/1985 | Sisler | 339/49 R |
| 5,227,957 | 7/1993 | Deters | 361/395 |
| 5,515,239 | 5/1996 | Kamerman et al. | 361/727 |
| 5,602,721 | 2/1997 | Slade et al. | 361/727 |
| 5,604,662 | 2/1997 | Anderson et al. | 361/727 |
| 5,737,189 | 4/1998 | Kammersfard et al. | 361/726 |

*Primary Examiner*—David P. Bryant
*Assistant Examiner*—Jermie E. Cozart
*Attorney, Agent, or Firm*—Ronald E. Smith; Smith & Hopen, P.A.; Anton J. Hopen

[57] ABSTRACT

A method of manufacturing and assembling a computer system from modular parts that are vertically stacked relative to one another. Each module has a predetermined geometrical configuration and interlocks only with other modules of the same geometrical configuration. Computer components are housed within modules of predetermined geometrical configuration so that a consumer purchasing a computer system by purchasing modules need only match module shapes to ensure component compatibility. A consumer may purchase a first module containing a computer component of the consumer's choice and complete a computer system of compatible components by purchasing additional modules having the same shape as the first module. In a preferred embodiment, each component is operated by a dedicated processing unit ("DPU") and operating system dedicated to it to avoid the limitations of computer systems that rely upon general purpose operating systems.

3 Claims, 2 Drawing Sheets

40

10

20

30

METHOD FOR MANUFACTURE AND ASSEMBLY OF COMPUTERS

CROSS-REFERENCE TO RELATED DISCLOSURES

This is a continuation-in-part of U.S. patent application Ser. No. 08/840,028 now U.S. Pat. No. 5,909,357, entitled "Vertically Stacked Computer Components with Cooling Shaft," filed by the present inventor on Apr. 24, 1997. That disclosure is fully incorporated into this disclosure by reference.

BACKGROUND OF THE INVENTION

1. Field of the Invention

The present invention relates generally to a method of manufacturing and assembling computers from a plurality of individual components where the compatibility of each component is identified by its shape and to a method for building a computer having no general purpose operating system.

2. Description of the Prior Art

Compatibility among components in a computer system represents a significant problem in the personal computer industry. Many consumers purchase new parts for their computers in an attempt to improve performance or to provide additional features, only to discover that the newly purchased component cannot be added to their existing system. Visual inspection of the new components is of little value because the known components lack distinctive design features. An incompatible component may disable the operability of other programs, the operating system, or even physically damage other hardware.

Another problem of non-distinct components is that many component manufacturers are at the mercy of larger computer assemblers. Most name brand computer companies are mere assemblers; they manufacture no components whatsoever. The manufacturers of components are at the mercy of such assemblers because the component manufacturers lack the means to sell their components directly to consumers. There have been cases where advanced components were withheld from the market for up to a year or more by computer assemblers who want to sell their inventory of computers with old components before allowing the public to have access to the improved components. Such practice damages the public's access to new technologies as well as the component manufacturers' ability to offer new technologies to consumers.

Thus, a need exists for a method that enables component manufacturers to sell their components directly to the public without the interference of computer assemblers.

Another very significant limitation of today's personal computer industry is its reliance upon central processing unit (CPU) architecture. Such architecture requires a single CPU to handle all processing demands and an operating system to manage the resources of the CPU. As new software applications are added, the operating system is changed and often degraded, with the result that earlier applications perform at a reduced level of effectiveness. Thus, as a user purchases and installs more and more software applications, the burden on the CPU increases and processing times slow down, and the entire system becomes less stable. The user can even lose the ability to run old software when the operating system of the computer is upgraded.

By way of analogy, if upgrading a home entertainment center by adding a DVD player were to cause the loss of a graphic equalizer or other component and to degrade the overall sound quality of the system, consumers would not accept such technology. Consumers are forced to accept degraded performance, lost functions and frequent crashes as being an inherent, unavoidable part of currently available computer systems due to the lack of an alternative to CPU architecture or paradigm.

Dedicated or specific function computers having their own operating systems operate much faster than general function computers with one-size-fits-all operating systems. For example, a Nintendo 64® game has its own dedicated 64-bit processor and its own operating system.

The interaction between software applications and computer hardware is complex and often unstable. Accordingly, computer systems that rely upon generic operating systems are subject to frequent crashing and the concomitant loss of data. A user of such a system must develop, at considerable expense, a back-up system to restore data after a crash.

A computer system where each application would have its own dedicated hardware and software is significantly faster and more reliable than a CPU "box" computer that must compromise performance and stability by sharing system resources among many applications. The CPU paradigm that dominates the computer industry has resulted in a monolithic "box" design that causes computers of differing ages, capability and price to look the same. Moreover, the well-known box design raises the upgrade threshold because the industry must make obsolete the entire contents of the box before consumers will feel compelled to upgrade. In other words, a consumer will be reluctant to purchase an entirely new computer system just to get a better modem. Only when all or most of the components have been made obsolete will the typical consumer relent and purchase an entirely new system.

Unfortunately, when a general purpose operating system is upgraded, many older software applications become obsolete, forcing consumers to re-purchase upgraded versions of applications. If the automotive industry were to manufacture cars that looked the same every year, but occasionally were provided with different engines that required different fuels, making all previous engines and fuels obsolete, consumers would not accept such practice. The computer industry gets away with such practice only because computer consumers have no alternative computer systems available to them.

However, in view of the art considered as a whole at the time the present invention was made, it was not obvious to those of ordinary skill in this art how to overcome the compatibility and operating system limitations of commercially-available personal computer systems.

SUMMARY OF THE INVENTION

The long-standing but heretofore unfulfilled need for a method of manufacturing and assembling computers that would resolve the current compatibility and availability problems is now met by a new, useful and nonobvious invention. Moreover, the present invention provides a method for building computer systems that are not reliant upon general purpose operating systems.

The present invention provides a method of manufacturing and assembling a computer system including the step of selecting a plurality of modules, each of which houses a component having utility in a computer system, where each module has a common predetermined geometric configuration indicating its ability to compatibly function with other modules of the same geometric configuration. Modules having the same geometric configuration are interlocked together. In a preferred embodiment, the modules are stacked vertically and modules having different compatibility will not interlock with each other.

In a preferred embodiment of this invention, each module has its own processor or dedicated processor unit ("DPU") and its own operating system dedicated to said DPU. Thus, when a computer system has been built by stacking a plurality of such modules, there is no need for a general purpose operating system. A browser means is the only tool needed to allow the user to select the applications desired for use. As a result, the resulting computer system is fast in operation, stable, and expandable without degradation.

More particularly, the steps of the novel method of assembling a computer system include the steps of selecting a plurality of modules, each module housing a component having utility in a computer system and having a common predetermined geometric configuration indicating the ability of the module to compatibly function with other modules of identical geometric configuration, and interlocking the plurality of modules together.

The step of interlocking the modules together is accomplished by vertically stacking the modules.

The method further includes the step of preventing interlocking of modules having different geometric configurations, and that step includes the step of configuring a unique interlocking means for each geometric configuration.

The novel method of manufacturing modules for a computer system includes the steps of selecting a computer component having utility in a computer system, identifying the compatibility of the computer component with an array of compatible computer components, installing the computer component inside a module fashioned in a predetermined geometric configuration consistent with the array of compatible computer components, and providing an interlocking means for interconnecting a plurality of modules having a common geometric configuration to work compatibly as a computer system. The step of interconnecting the modules is accomplished by vertically stacking them. Interlocking the modules having different geometric configurations is prevented by configuring a unique interlocking means for each geometric configuration.

The present invention solves significant problems in the art by providing manufacturers the ability to make compatible modules having a common predetermined geometric configuration so that consumers may ensure compatibility of components by purchasing modules having a common predetermined geometric configuration. Thus, if two modules fit together, their components are compatible with one another. If two modules do not fit together, their respective components are incompatible with each other.

Another benefit of this invention is that the component manufacturer will save operating expenses by reduced technical support related to compatibility problems.

Still another benefit is that retail distributors of components utilizing this invention will experience a reduced number of returned purchases for incompatibility problems.

When each application is housed in its own module, there is no need for a general purpose operating system to run a plurality of miscellaneous applications. Each application can have its own DPU and its own dedicated operating system. Thus, each application is more stable and operates faster. Moreover, adding new applications does not degrade or disable earlier applications. All that is needed is a browser means to enable a user to select which application is to be used.

It is a primary object of this invention to assist consumers and manufacturers in purchasing and manufacturing new components in a manner that facilitates the purchase of new components that are compatible with preexisting components.

Another major object is to provide a computer system that is not reliant upon a general purpose operating system and which is therefore faster in operation, more stable, and expandable in the absence of system degradation.

These and other important objects, advantages, and features of the invention will become clear as this description proceeds.

The invention accordingly comprises the methods that will be exemplified in the description set forth hereinafter and the scope of the invention will be indicated in the claims.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

Figure 1:
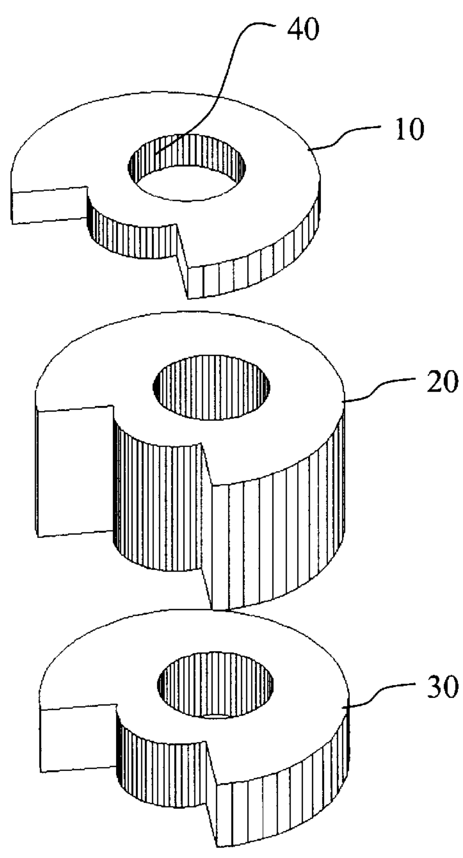
FIG. 1 is an exploded perspective view of an embodiment of a first array of compatible component modules according to the invention.

Referring initially to FIG. 1, it will there be seen that an embodiment of the present invention is represented by three vertically stacked computer modules wherein the three components, 10, 20, and 30 have a consistent geometric configuration making them easily identifiable to the consumer. As an example, application component 10 vertically interlocks with base communication component 20 which, in turn, interlocks with power supply component 30. All the components in FIG. 1 are compatible which is evidenced by their common geometric configuration. All three components in FIG. 1 interlock and communicate data and/or provide voltage through a common interface bus 40.

Since each module is visible to a user, a function light means such as lights 11 and 13, 21 and 23, and 31, 33 may be provided. Lights 11, 21 and 31 could be green LEDs indicating that their respective components are operating and lights 13, 23 and 33 could be red LEDs indicating that their respective components are not functioning. This advantageous feature facilitates repair. In conventional, box computer systems, the internal components are not visible unless the box housing is first removed and even then there are no facile means for indicating whether or not a particular component is functioning.

Figure 2:
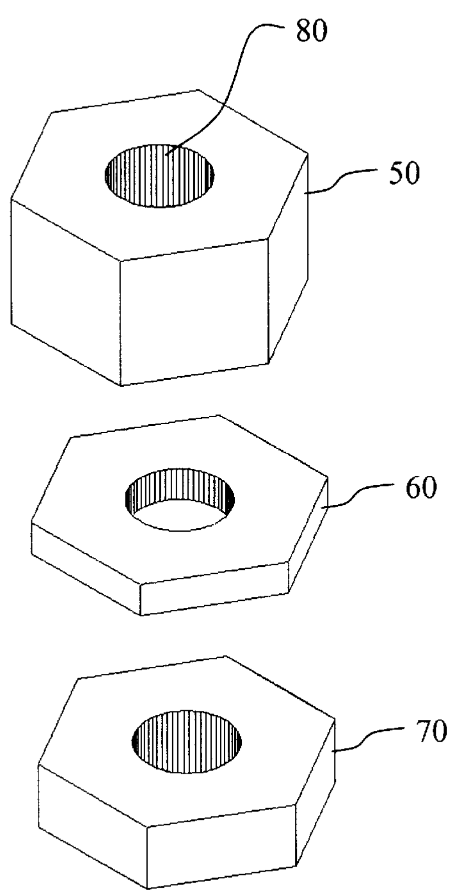
FIG. 2 is an exploded perspective view of an embodiment of a second array of compatible component modules according to the invention.

Referring to FIG. 2, components 50, 60 and 70 have a hexagonal geometric configuration which is clearly distinguishable from the geometric configuration of the components in FIG. 1. Similar to the interface bus 40 in FIG. 1, a variant interface bus 80 in FIG. 2 is common only to the common geometric configuration shared by the components of FIG. 2. By this method, incompatible components are not only visually distinct, but they do not interlock, thereby preventing possible hardware incompatibilities or even physical damage.

As in the first example, components 50, 60 and 70 may be provided with function lights or other means of visually displaying the status of the component 51 and 53, 61 and 63, and 71, 73, said lights having the same purpose as described above.

Figure 3:
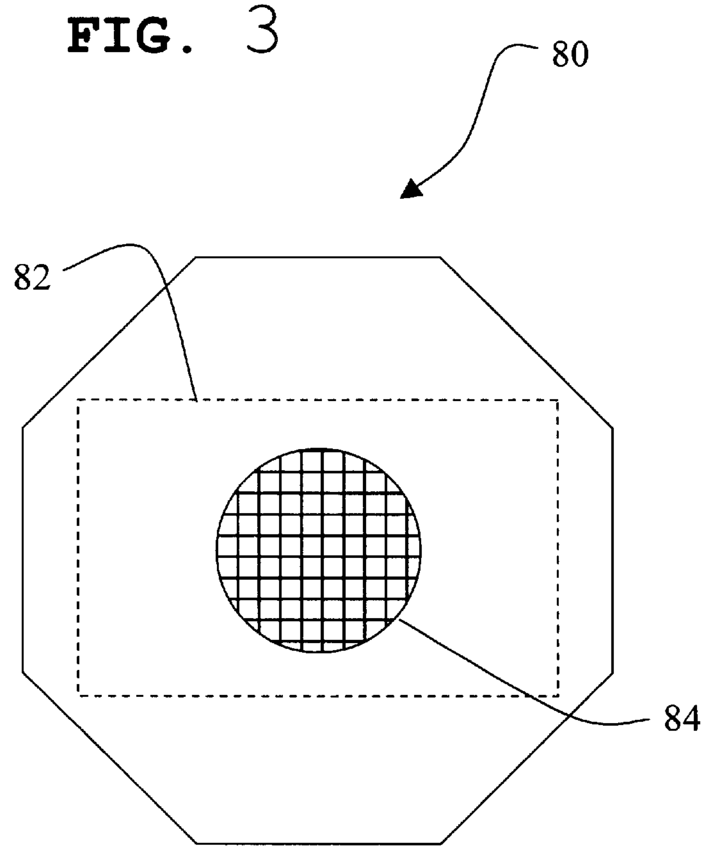
FIG. 3 is a top plan view of a module.
Figure 4:
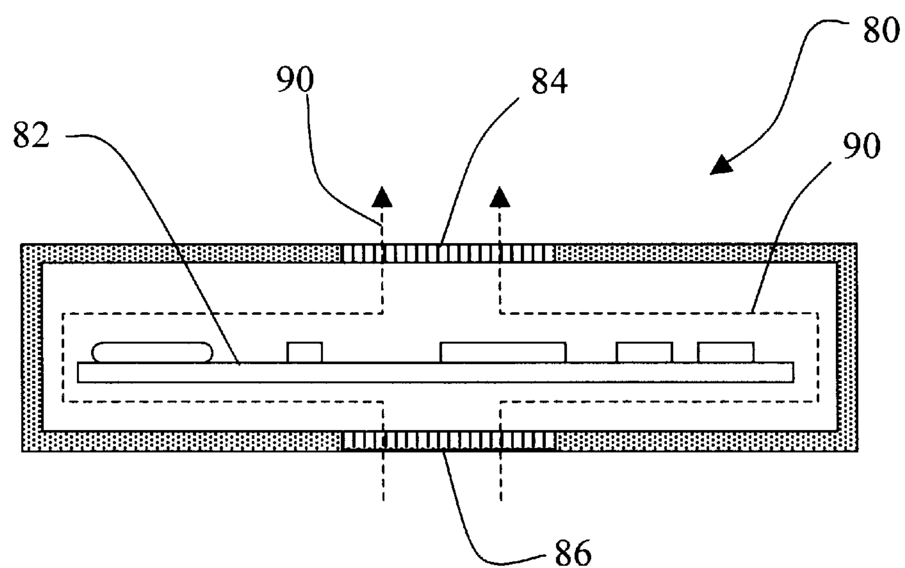
FIG. 4 is a side elevational view of a module.

FIGS. 3 and 4 depict a module 90 in top and side elevation views, respectively. Component 82 housed therein is provided in the form of a circuit board and is protected against physical damage by screens 84, 86 at the top and bottom of central bore 92. As best understood in connection with FIG. 4, the open mesh structure of the screens allows cooling air to circulate through the module as indicated by directional arrows 94.

As purchasers of computer hardware know, not all hardware can be used in all computers due to compatibility problems. Many people buy hardware components such as a hard drive, for example, from catalogs and then discover that the new hardware is incompatible with their computer. By packaging hardware components in vertically stackable modules, manufacturers can identify the compatibility of their hardware by manufacturing it in modules having a shape that interlocks only with modules of other computer components with which said hardware is compatible.

The same observation applies to all hardware components. Not all components will be compatible with a particular system architecture. As a result, many people are hesitant to purchase new components when they are unsure as to compatibility. This invention, by introducing a method utilizing modules having particular shapes to indicate with which other components they may be used, clearly solves this problem. If a person owns a system component of a particular shape, that person knows that any CD-ROM, DVD, hard drive, and so on that is packaged in a module of the same shape is compatible with that system component. In the depicted example of FIG. 2, the computer housing has an hexagonal shape. Thus, all components packaged in an hexagonal module will be compatible with one another because manufacturers who adopt the present invention will know not to package incompatible components in modules having the same geometric configuration. Consumers will know that if they purchase components that are housed in modules having the same shape as their existing modules, then compatibility is ensured. This simple but revolutionary concept gives component manufacturers direct access to consumers, bypassing assemblers. People lacking computer literacy can call a manufacturer and order components without difficulty. For example, a caller could order a DVD player and tell the manufacturer that their stack is square, circular, hexagonal, and so on; the manufacturer can then fill the order by shipping a DVD player in a module of matching shape. In a retail setting, a customer lacking computer literacy can simply purchase a new communication component having six sides, for example, without having to worry about compatibility, if the other modules of his or her computer has that number of sides.

Whenever a component manufacturer develops an improved component, that manufacturer will no longer be at the mercy of computer assemblers because the new, improved component can be sold directly to consumers. This frees component manufacturers and the purchasing public from the control of computer assemblers. Since component modules having the same shape will be compatible with one another, there is no worry about damaging a computer by adding an incompatible component.

Once computer component manufacturers adopt this breakthrough invention as the industry standard, there will be no further need for computer assemblers. Any layperson will be able to assemble a computer system by simply buying modules that physically match one another. This frees computer purchasers from having to take whatever configurations the computer assemblers have prepared for them.

Moreover, computer assemblers often purchase the cheapest individual components available. Thus, a cool-operating power supply already in production that does not require a big, noisy fan such as required by cheap power supplies is not readily available to consumers because computer assemblers do not wish to increase the cost of their packages. If the quiet-running power supply were available in its own module, which module would be appropriately shaped to indicate its compatibility, then those consumers who value a quiet computer could pay the required premium and enjoy the resulting quietude. The same observation applies to improved hard drives and the like.

In one embodiment, this invention enables consumers to purchase a particular general purpose operating system if they so choose. Currently, most personal computer consumers simply accept the operating system that is pre-installed on the computer they purchase. With this invention, makers of rival general purpose operating systems can manufacture modules of differing shapes containing their respective operating systems, and consumers desiring to own a particular general purpose operating system could purchase such system without worrying about compatibility problems. The consumer would complete the assembly of a computer system having a selected operating system by purchasing modules having the shape of the operating system module. This prevents one operating system supplier from monopolizing the field. However, consumers who choose this embodiment of the invention would still have a general purpose operating system as a part of their computer system.

In the preferred embodiment, instead of purchasing a module having a general purpose operating system, for use with other modules lacking their own operating systems, this invention includes modules having their own independent DPU and their own independent, dedicated operating system. This eliminates the need for a general purpose operating system and provides a stack of computer components which are mechanically connected to their contiguous modules and which share a common bus for electrical power and data sharing purposes but which are otherwise functionally independent from one another so that future additions to the stack have no affect on the performance of the system. Since each module stands alone from a functional standpoint, the novel system provides a computer system that operates much faster and more reliably than conventional systems having a single CPU and a general purpose operating system that handles all application programs.

It will be seen that the objects set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A method of assembling a computer system, comprising the steps of:

selecting a plurality of modules, each module housing a component having utility in a computer system and having a common predetermined geometric configuration indicating the ability of said module to compatibly function with other modules of identical geometric configuration;

vertically stacking said modules;

providing each component in said stack with a dedicated processing unit and operating system so that each component functions independently of all other components in said stack whereby addition to said stack of additional components does not degrade the performance of components in said stack prior to said addition.

2. The method of claim 1, wherein said plurality of modules includes a plurality of application components and further comprising the step of providing a browser means as a part of said computer system for facilitating selection by a user of a particular application component.

3. The method of claim 1, further including the step of providing each module in said computer system with a function display means for indicating the functional status of the component housed in each said module.

* * * * *